(12) United States Patent
Baek

(10) Patent No.: US 11,189,581 B2
(45) Date of Patent: Nov. 30, 2021

(54) ELECTRONIC DEVICE INCLUDING SEMICONDUCTOR PACKAGE INCLUDING PACKAGE BALL

(71) Applicant: SAMSUNG ELECTRONICS CO., LTD., Suwon-si (KR)

(72) Inventor: Seung-Hee Baek, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/532,544

(22) Filed: Aug. 6, 2019

(65) Prior Publication Data
US 2020/0075509 A1 Mar. 5, 2020

(30) Foreign Application Priority Data
Aug. 30, 2018 (KR) .................. 10-2018-0103032

(51) Int. Cl.
H01L 23/64 (2006.01)
H01L 23/538 (2006.01)
H01L 23/31 (2006.01)
H01L 23/498 (2006.01)

(52) U.S. Cl.
CPC .......... H01L 23/64 (2013.01); H01L 23/3114 (2013.01); H01L 23/49816 (2013.01); H01L 23/49822 (2013.01); H01L 23/5384 (2013.01)

(58) Field of Classification Search
CPC ........... H01L 23/64; H01L 2924/30111; H01L 2924/19051; H05K 2201/0776; H05K 1/025; H05K 1/0242; H05K 1/66
See application file for complete search history.

(56) References Cited

U.S. PATENT DOCUMENTS

| 6,602,078 | B2 * | 8/2003 | Kwark | H01P 1/047 361/792 |
| 7,310,239 | B1 * | 12/2007 | Fjelstad | H01L 23/13 257/E23.004 |
| 7,388,424 | B2 * | 6/2008 | Miller | G01R 31/31716 324/754.07 |
| 7,755,181 | B2 | 7/2010 | Han et al. | |
| 8,624,692 | B2 * | 1/2014 | Kato | H03H 7/38 333/238 |
| 8,643,168 | B1 | 2/2014 | Wong et al. | |
| 9,024,326 | B2 * | 5/2015 | Actis | H01L 23/373 257/76 |

(Continued)

FOREIGN PATENT DOCUMENTS

| JP | H11163489 A | 6/1999 |
| JP | 2009055019 A | 3/2009 |

(Continued)

Primary Examiner — David A Zarneke
(74) Attorney, Agent, or Firm — Volentine, Whitt & Francos, PLLC

(57) ABSTRACT

A semiconductor device package includes a semiconductor chip mounted to an upper surface of a package substrate by a package ball. The package substrate includes a ball pad on the upper surface of the package substrate and connected to the package ball, a signal trace located below the upper surface of the package substrate, and an impedance matching element connected between the ball pad and the signal trace. The impedance matching element is configured to establish impedance matching with a termination impedance of the semiconductor chip.

19 Claims, 25 Drawing Sheets

(56) References Cited

U.S. PATENT DOCUMENTS

| | | | |
|---|---|---|---|
| 9,349,692 B2 | 5/2016 | Pan et al. | |
| 9,519,308 B2 | 12/2016 | Shen et al. | |
| 9,608,304 B2* | 3/2017 | Yosui | H05K 3/00 |
| 9,848,488 B1* | 12/2017 | Moncayo | H01L 23/49838 |
| 10,117,327 B2* | 10/2018 | Shiozaki | H05K 1/025 |
| 10,312,193 B2* | 6/2019 | Gu | H01L 21/768 |
| 10,356,904 B2* | 7/2019 | Stahr | H05K 3/40 |
| 10,685,942 B2* | 6/2020 | Liu | H01L 23/49827 |
| 10,748,842 B2* | 8/2020 | Qian | H01L 21/68 |
| 2001/0054938 A1* | 12/2001 | Miller | H05K 1/025 |
| | | | 333/33 |
| 2002/0074654 A1* | 6/2002 | Koriyama | H01L 23/66 |
| | | | 257/728 |
| 2005/0230823 A1* | 10/2005 | Ohsaka | H01L 23/66 |
| | | | 257/735 |
| 2008/0191362 A1* | 8/2008 | Chuang | H01P 5/02 |
| | | | 257/777 |
| 2009/0152689 A1* | 6/2009 | Nease | H05K 1/0251 |
| | | | 257/664 |
| 2010/0258905 A1* | 10/2010 | Song | H01L 25/0655 |
| | | | 257/532 |
| 2010/0258951 A1* | 10/2010 | Gabara | B01L 3/502715 |
| | | | 257/777 |
| 2011/0095851 A1* | 4/2011 | Wyland | H05K 1/0251 |
| | | | 333/219 |
| 2013/0265734 A1* | 10/2013 | Herbsommer | G02B 6/12004 |
| | | | 361/783 |
| 2013/0285769 A1* | 10/2013 | Gerlach | H05K 1/024 |
| | | | 333/238 |
| 2013/0286620 A1* | 10/2013 | Colussi | H01L 23/552 |
| | | | 361/783 |
| 2013/0321104 A1* | 12/2013 | Hurwitz | H01P 3/085 |
| | | | 333/238 |
| 2019/0181080 A1* | 6/2019 | Cheah | H01L 23/66 |
| 2019/0269021 A1* | 8/2019 | Nufio-Molina | H05K 3/4623 |
| 2019/0304952 A1* | 10/2019 | Weis | H01L 23/66 |
| 2019/0335579 A1* | 10/2019 | Wyland | H05K 1/116 |
| 2019/0357351 A1* | 11/2019 | Park | H01L 23/5383 |
| 2019/0363423 A1* | 11/2019 | Lu | H01Q 1/2283 |
| 2019/0371747 A1* | 12/2019 | Wilcox | H01L 23/49816 |

FOREIGN PATENT DOCUMENTS

| | | |
|---|---|---|
| JP | 2017216367 A | 12/2017 |
| KR | 1020060075070 A | 7/2006 |

* cited by examiner

ELECTRONIC DEVICE INCLUDING SEMICONDUCTOR PACKAGE INCLUDING PACKAGE BALL

CROSS-REFERENCE TO RELATED APPLICATION

A claim of priority is made to Korean Patent Application No. 10-2018-0103032, filed Aug. 30, 2018, in the Korean Intellectual Property Office, the disclosure of which is incorporated herein in its entirety by reference.

BACKGROUND

The inventive concept relates to semiconductor packages, and more particularly, to semiconductor device packages including semiconductor chips mounted to a package substrate.

In high speed communications, electrical signals are especially sensitive to impedance mismatches. Indeed, impedance mismatch can be a significant source of signal loss and reduced signal integrity. The challenges associated with impedance mismatch can be particularly acute when designing semiconductor package having multiple chips communicating with one another.

SUMMARY

According to an aspect of the inventive concept, a semiconductor device package is provided which includes a semiconductor chip mounted to an upper surface of a package substrate by a package ball. The package substrate includes a ball pad on the upper surface of the package substrate and connected to the package ball, a signal trace located below the upper surface of the package substrate, and an impedance matching element connected between the ball pad and the signal trace. The impedance matching element is configured to establish impedance matching with a termination impedance of the semiconductor chip.

According to another aspect of the inventive concept, a semiconductor device package is provided which includes a semiconductor chip mounted to an upper surface of a package substrate by first and second package balls. The package substrate includes a first ball pad on the upper surface of the package substrate and connected to the first package ball, and a second ball pad on the upper surface of the package substrate and connected to the second package ball. The package substrate further includes first and second signal traces extending parallel to each other and located below the upper surface of the package substrate, a first impedance matching element connected between the first ball pad and the first signal trace, and a second impedance matching element connected between the second ball pad and the second signal trace. The first impedance matching element is configured to establish impedance matching with a first termination impedance of the semiconductor chip, and the second impedance matching element is configured to establish impedance matching with a second termination impedance of the semiconductor chip.

According to another aspect of the inventive concept, a semiconductor device package is provided which includes a first semiconductor chip mounted to an upper surface of a package substrate by first and second package balls, and a second semiconductor chip mounted on the upper surface of the package substrate by third and fourth package balls. The package substrate includes first and second ball pads on the upper surface of the package substrate and connected to the first and second package balls, respectively, third and fourth ball pads on the upper surface of the package substrate and connected to the third and fourth package balls, respectively, and first and second signal traces extending parallel to each other and located below the upper surface of the package substrate. The package substrate further includes a first impedance matching element connected between the first ball pad and one end of the first signal trace, and a second impedance matching element connected between the second ball pad and one end of the second signal trace, the first and second impedance matching elements configured to establish impedance matching with first and second termination impedances of first semiconductor chip, respectively. The package substrate further includes a third impedance matching element connected between the third ball pad and another end of the first signal trace, and a fourth impedance matching element connected between the fourth ball pad and another end of the second signal trace, the third and fourth impedance matching elements configured to establish impedance matching with third and fourth termination impedances of second semiconductor chip, respectively.

According to another aspect of the inventive concept, a semiconductor device package is provided which includes a semiconductor chip mounted to an upper surface of a package substrate by a package ball, the package substrate including an impedance matching element configured to establish impedance matching with a termination impedance of the semiconductor chip.

According to another aspect of the inventive concept, a semiconductor device package is provided which includes first and second semiconductor chips communicating differential signals and mounted to an upper surface of a package substrate by a package ball, the package substrate including an impedance matching element configured to establish impedance matching in a differential signal path with a termination impedance of at least one of the first and second semiconductor chips.

According to another aspect of the inventive concept, a semiconductor device package is provided which includes a semiconductor chip mounted to an upper surface of a package substrate by a package ball, the package substrate comprising an spiral inductor located at the upper surface of the package and configured to establish impedance matching with a termination impedance of the semiconductor chip.

BRIEF DESCRIPTION OF THE DRAWINGS

Embodiments of the inventive concept will be more clearly understood from the detailed description that follows, taken in conjunction with the accompanying drawings, in which.

DETAILED DESCRIPTION OF THE EMBODIMENTS

Hereinafter, embodiments will be described in detail with reference to the accompanying drawings.

Figure 1:
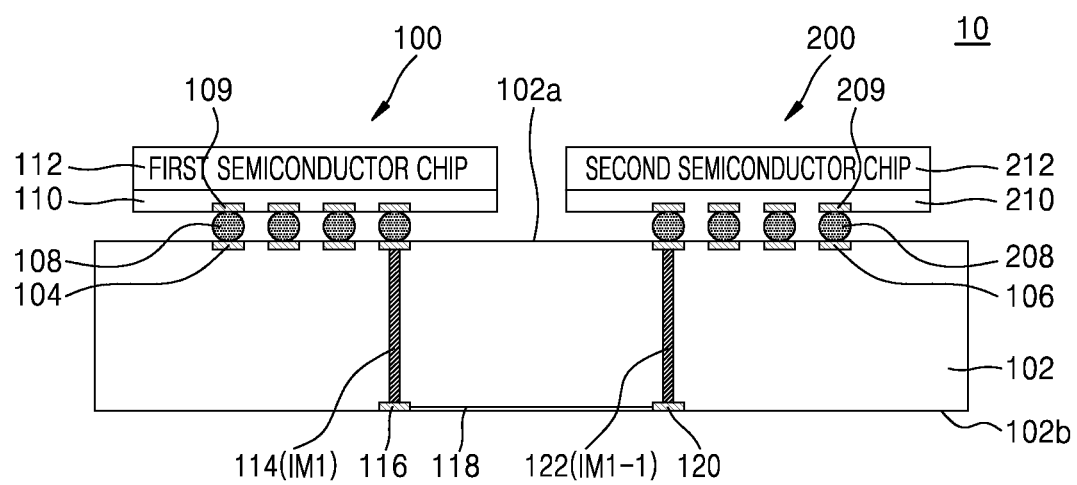
FIG. 1 is a cross-sectional view illustrating a main portion of an electronic device according to an embodiment.

FIG. 1 is a cross-sectional view illustrating principal components of an electronic device 10 according to an embodiment.

Referring to FIG. 1, the electronic device 10 of the example of this embodiment includes a system substrate 102 and a plurality of semiconductor devices 100 and 200 horizontally spaced apart over an upper surface 102a of the system substrate 102. The system substrate 102 may, for example, be a printed circuit board (PCB) that supports and electrically connects the semiconductor devices 100 and 200. As generally illustrated in FIG. 1, the semiconductor devices 100 and 200 may be packages each having semiconductor chips 112 and 212 and underlying package substrates 110 and 210, respectively. For example, the one or both of the semiconductor devices 100 and 200 may be a ball grid array (BGA) package, where the package substrates 110 and 210 are BGA package substrates. However, the embodiments are not limited in this fashion. In addition, each of the semiconductor devices may include multiple semiconductor chips configured as a multi-chip package. In this case, the semiconductor chips of each package may be stacked in a vertical direction relative to the horizontal upper surface 102a of the system substrate 102.

The electronic device 10 of the example of this embodiment further includes a first plurality of package balls 108 interposed between the first semiconductor device 100 and the system substrate 102, and a second plurality of package balls 208 interposed between the second semiconductor device 200 and the system substrate 102. In particular, as shown in FIG. 1, the package balls 108 may be connected between first device ball pads 109 located along a lower surface of the first semiconductor device 100 and first upper ball pads 104 located along the upper surface 102a of the system substrate 102, and the package balls 208 may be connected between second device ball pads 209 located along a lower surface of the second semiconductor device 200 and second upper ball pads 106 located along the upper surface 102a of the system substrate 102. In the particular example of FIG. 1, the first device ball pads 109 are located along a lower surface of the package substrate 110 of the first semiconductor device 100, and the second device ball pads 209 are located along a lower surface of the package substrate 210 of the second semiconductor device 200.

The electronic device 10 of the example of this embodiment further includes a plurality of conductive vias 114 and 122 which constitute impedance matching elements IM1 and IM1-1, respectively. In the particular example of FIG. 1, the first impedance matching element IM1 is connected between a first upper ball pad 104 and a first lower pad 116 located along a lower surface 102b of the system substrate 102, and the second impedance matching element IM1-1 is connected between a second upper ball pad 106 and a second lower pad 120 located along the lower surface 102b of the system substrate 102. Further, in the particular example of FIG. 1, a signal trace 118 extends along the lower surface 102b of the system substrate 102 between the lower pad 116 and the lower pad 120. Herein, the phrase "signal trace" is broadly defined to include any electrically conductive medium, such as wires and patterned conductive layers extending between the lower pads 116 and 120.

As will be described in more detail later herein, the impedance matching elements IM1 and IM1-1 (i.e., conductive vias 114 and 122) are configured to establish impedance matching with a termination resistance of the semiconductor devices 100 and 200.

In FIG. 1, for convenience of illustration, two semiconductor devices 100 and 200 are shown as being mounted on the system substrate 102, but the embodiments are not limited in this fashion. In other embodiments, three or more semiconductor devices may be mounted on the system substrate 102. In addition, other elements (for example, passive elements or active elements) may be further mounted on the system substrate 102.

In the example of the present embodiment, semiconductor devices 100 and 200 are ball grid array (BGA) packages in which the underside of the devices are used to place a grid of ball pads respectively coupled to package balls (e.g., solder balls). However, the inventive concepts are not limited to BGA packages, and other types of connection schemes may be adopted within the scope of the inventive concepts. Further, it is noted that the term "package ball" is broadly defined herein to include any conductive material generally in the form of a ball or bump connected between confronting pads of devices and/or substrates.

As previously mentioned, the system substrate 102 of the example of FIG. 1 includes an upper surface 102a and a lower surface 102b. In one example, the system substrate 102 may be a printed circuit board (PCB), which may be a single-sided or a double-sided PCB, and which may be a single-layer or multi-layer PCB.

Material examples of the system substrate 102 include phenolic resin, epoxy resin, and/or polyimide. More specific examples of system substrate 102 include frame retardant 4 (FR4), tetrafunctional epoxy, polyphenylene ether, epoxy/polyphenylene oxide, bismaleimide triazine (BT), thermount, cyanate ester, polyimide, and/or a liquid crystal polymer.

As previously described, a plurality of upper ball pads 104 and 106 may be provided on the upper surface 102a of the system substrate 102, and a plurality of lower pads 116 and 120 may be provided on the lower surface 102b of the system substrate 102. The semiconductor devices 100 and 200 of the example of FIG. 1 are electrically connected to each other by a signal path including one of the package ball pads 109, one of the first package balls 108, one of first upper ball pads 104, the first impedance matching element IM1, the lower pad 116, the signal trace 118, the lower pad 120, the second impedance matching element IM1-1, one of the second upper ball pads 106, one of the second package balls 208, and one of the package ball pads 209. An electrical signal having a target impedance (for example, 50 ohms) may be transferred through the package balls 108 and 208. The electrical signal may, for example, be one of two differential signals transferred through the package balls 108 and 208. In this case, a similar signal path may be provided for transferring the other of the two differential signals.

As described previously, the first semiconductor device 100 may be a first package, (for example, a first BGA package) including the first semiconductor chip 112 provided on the first package substrate 110, and the second semiconductor device 200 may be a second package (for example, a second BGA package) including the second semiconductor chip 212 provided on the second package substrate 210. The package substrates 110 and 210 may be formed of a same material as that of the system substrate 102, although the embodiments are not limited in this fashion. Further, each the package substrates 110 and 210 may have a thickness which is less than that of the system substrate 102, but again the embodiments are not limited in this fashion.

The package balls 108 may be arranged in a central region and/or a peripheral region of the lower surface of the first semiconductor device 100, and the package balls 208 may be arranged in a central region and/or a peripheral region on the lower surface of the second semiconductor device 200. However, the embodiments are not limited to any particular arrangement of the package balls 108 and 208 on the respective lower services of the semiconductor devices 100 and 200.

In an example embodiment, the first and second semiconductor devices 100 and 200 have different functionalities. In another example embodiment, the first semiconductor device 100 includes the first semiconductor chip 112 which is a memory controller for controlling one or more memory chips (not shown), and the second semiconductor device 200 includes the second semiconductor chip 212 which is a main processor or application processor for controlling the memory controller of the first semiconductor device 100.

The impedance matching elements IM1 and IM1-1, which are respectively and electrically connected to the top pads 104 and 106 to compensate for an impedance mismatch caused by the package balls 108 and 208, may be provided in the system substrate 102. The impedance matching elements IM1 and IM1-1 may be conductive vias 114 and 122 as in the example of the present embodiment. The conductive via 114 may be a through via passing through an opening between an upper ball pad 104 and the lower pad 116 of the system substrate 102, and the conductive via 122 may be a through via passing through an opening between the an upper ball pad 106 and the lower pad 120 of the system substrate 102.

In FIG. 1, the impedance matching elements IM1 and IM1-1 are the conductive vias 114 and 122 are illustrated as being provided under two package balls 108 and 208, but the embodiments are not limited thereto. In other embodiments, the impedance matching elements IM1 and IM1-1 may be provided under three or more of the package balls 108 and 208.

In the example of the embodiments, the impedance matching elements IM1 and IM1-1 match impedances of signal transfer lines pass through the package balls 108 and 208. In particular, the impedance matching elements IM1 and IM1-1 may compensate for a mismatch of target impedance caused by the use of the package balls 108 and 208.

Impedance matching according to the embodiments may result in a reduction in reflection caused by an impedance difference between two different connection ends when an input end and an output end of a signal transfer line are connected to each other. Each of the impedance matching elements IM1 and IM1-1 may be an impedance matching element provided for a corresponding signal transfer line.

In the semiconductor devices 100 and 200, an electrical signal passing through each of the package balls 108 and 208 has a limitation in decreasing a capacitance, and due to this, in high speed communications, impedance may be reduced, causing the degradation in integrity of the electrical signal. When an electrical signal is transferred from the device ball pad 109 of the first semiconductor device 100 via the package ball 108, the conductive via 114, and the lower pad 116, the impedance matching element IM1 may compensate for the reduction in impedance caused by the package ball 108, and when an electrical signal is transferred from the device ball pad 209 of the second semiconductor device 200 via the package ball 208, the conductive via 122, and the lower pad 120, the impedance matching element IM1-1 may compensate for the reduction in impedance caused by the package ball 208.

The electronic device 10 of the embodiments utilizes the conductive vias 114 and 122 as the impedance matching elements IM1 and IM1-1. Generally, impedance increases as a length of each of the conductive vias 114 and 122 increases. The length of each of the conductive vias 114 and 122 may be designed based on a rise time of an electrical signal waveform obtained from the electronic device 10.

In the electronic device 10, an electrical signal may be transferred or received between the first semiconductor device 100 and the second semiconductor device 200. In FIG. 1, the impedance matching elements IM1 and IM1-1 are illustrated as being respectively provided under the package ball 108 of the first semiconductor device 100 and the package ball 208 of the second semiconductor device 200, but the inventive concept is not limited thereto. In other embodiments, the impedance matching elements IM1 and IM1-1 may be provided under only one of the first semiconductor device 100 and the second semiconductor device 200, based on a package design of the electronic device 10.

In description below, an example where the impedance matching element IM1 is provided under the package ball 108 of the first semiconductor device 100 will be described, but the description may be applied to an example where the impedance matching element IM1-1 is provided under the package ball 208 of the second semiconductor device 200.

Figure 2:
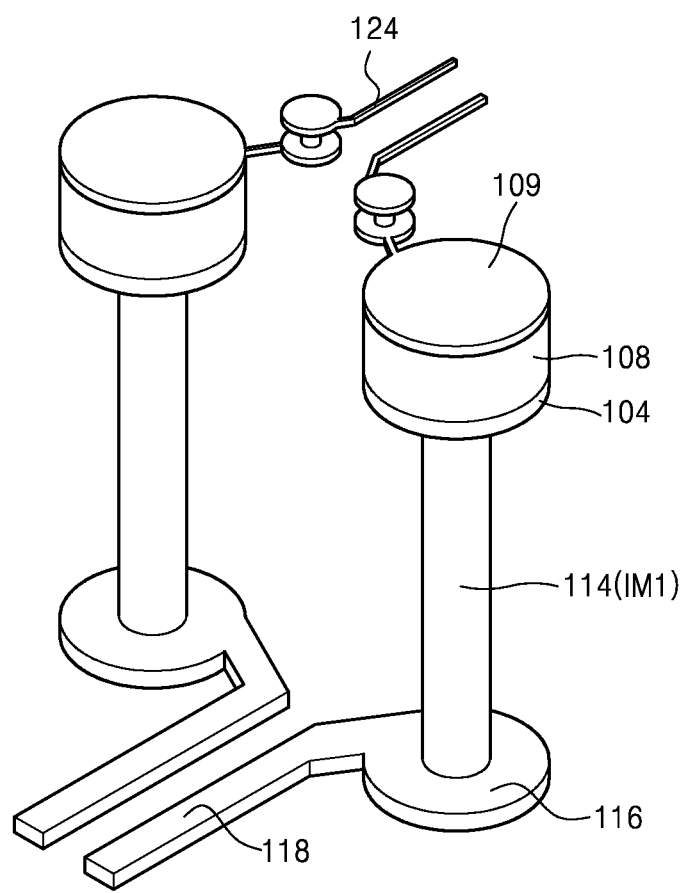
FIG. 2 is a perspective view illustrating a connection relationship between elements provided on and under a package ball of the electronic device of FIG. 1.
Figure 3:
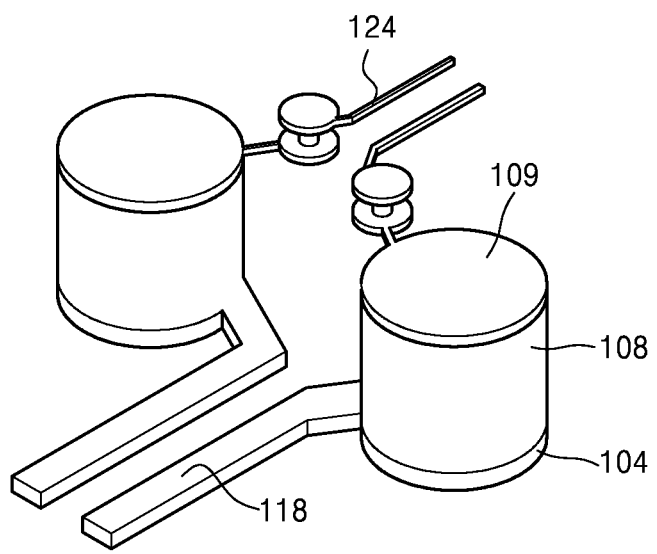
FIG. 3 is a perspective view illustrating a connection relationship between elements provided on and under a package ball of a comparative example for comparison with FIG. 2.

FIG. 2 is a perspective view for reference in describing an exemplary connection relationship between elements provided on and under a package ball of the electronic device 10 of FIG. 1, and FIG. 3 is a perspective view for reference in describing a connection relationship between elements provided on and under a package ball of a comparative example.

In particular, FIG. 2 is a diagram for describing an example of the configuration of connection elements provided on and under the first semiconductor device 100 of FIG. 1. In FIG. 2, for convenience, connection elements associated with two package balls 108 are illustrated which, as described above, may carry two differential signals. For illustrative purposes the package balls 108 are shown as being of a cylindrical shape, but the embodiments are not limited in this fashion.

As illustrated in FIG. 2, the first device ball pad 109 may be disposed on an upper surface of the package ball 108. The device ball pad 109 may be connected to a package conductive line 124. The package conductive line 124 may be a package trace line. A top pad 104 may be disposed on a lower surface of the package ball 108. The top pad 104 may be connected to a conductive via 114 provided in a board substrate (202 of FIG. 1).

The conductive via 114 may be an impedance matching element IM1 which compensates for a mismatch of target impedance (for example, 50Ω) of an electrical signal transferred through the package ball 108. The impedance matching element IM1 may be an element for impedance matching of a transfer line between the device ball pad 109 and the lower pad 116 with respect to the package ball 108. The conductive via 114 may be connected to the signal trace 118 through the lower pad 116.

In the example of FIG. 2, first and second ball pads 109 are located on the upper surface of the package substrate and connected to respective package balls 108. In addition, first and second signal traces 118 extend parallel to each other and are located below the upper surface of the package substrate (for example on a lower surface of the package substrate. First and second impedance matching elements 114 (IM1) are respectively connected between the first ball pad 109 and the first signal trace 118, and between the second ball pad 109 and the second signal trace 118. The first impedance matching element 114 (IM1) is configured to establish impedance matching with a first termination impedance of a semiconductor chip mounted on the upper surface of the package substrate, and the second impedance matching element 114 (IM1) is configured to establish impedance matching with a second termination impedance of the semiconductor chip. In an example embodiment, the first and second termination resistances are equal. Also in an example embodiment, the first and second signal traces 118 have a gap there between of 200 microns or less.

Returning to FIG. 1, in the example where the configuration of FIG. 2 is applied, a semiconductor device package 10 may include the first semiconductor chip 112 mounted to an upper surface of the package substrate 102 by package balls 108, and the second semiconductor chip 212 mounted on the upper surface of the package substrate 102 by package balls 208. In this case, the package substrate 102 may include ball pads 104 on the upper surface of the package substrate 102 and connected to the package balls 108, respectively, and ball pads 106 on the upper surface of the package substrate 102 and connected to the package balls 208, respectively. In addition, the package substrate 102 may include a pair of signal traces 118 extending parallel to each other and located below the upper surface of the package substrate 102. Further, the package substrate 102 may include an impedance matching element 114 (IM1) connected between one of the ball pads 104 and one end of one of the signal traces 118, and another impedance matching element 114 (IM1) connected between another one of the ball pads 104 and one end of the other of the signal traces 118. Here, the two impedance matching elements 114 (IM1) may be configured to establish impedance matching with respective termination impedances of first semiconductor chip 112. Still further, the package substrate 102 may include an impedance matching element 122 (IM1-1) connected between one of the ball pads 208 and another end of the one of the signal traces 118, and a another impedance matching element 122 (IM1-1) connected between another one of the ball pads and another end of the other signal trace 118. Here, the two impedance matching elements 122 (IM1-1) may be configured like the impedance matching elements 114 (IM-1) to establish impedance matching with respective termination impedances of second semiconductor chip 212.

Except for that the conductive via 114 and the impedance matching element IM1 are not disposed under the package ball 108, the comparative example illustrated in FIG. 3 may be the same as FIG. 2. The comparative example of FIG. 3 may be a case where an element for impedance matching of an electrical signal caused by the package ball 108 is not provided in a transfer line disposed on and under the package ball 108.

Figure 4:
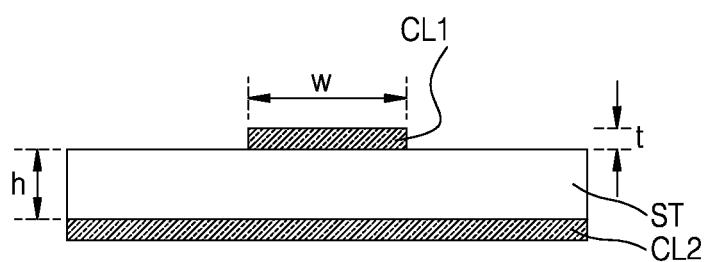
FIGS. 4 and 5 are diagrams for reference in describing an impedance mismatch of the electronic device of FIG. 1.
Figure 5:
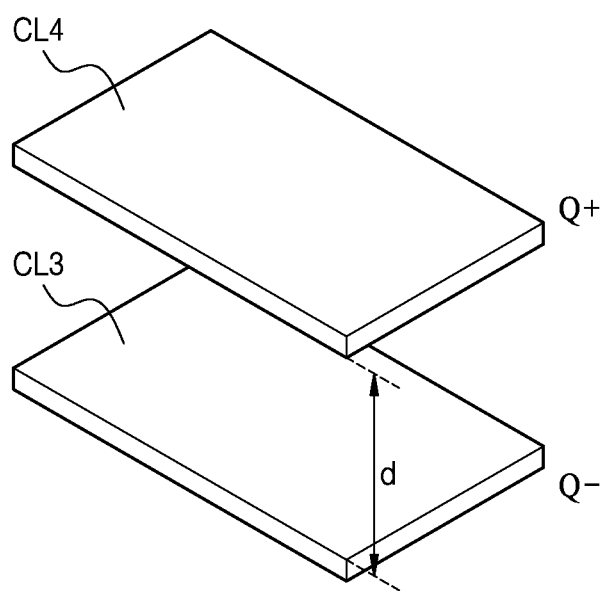

FIGS. 4 and 5 are diagrams for describing an impedance mismatch of the electronic device 10 of FIG. 1.

In detail, FIG. 4 is a diagram for describing characteristic impedance "$Z_0$" of a transfer line (or a conductive pattern) CL1 provided on a substrate ST. The substrate ST may be a system substrate or a board substrate described above. A ground line CL2 may be disposed under the substrate ST. The substrate ST may have a dielectric constant (relative permittivity) "$\varepsilon_r$". A width and thickness of the transfer line CL1 may respectively be w and t. A thickness of the substrate ST may be h.

The transfer line CL1 having a structure illustrated in FIG. 4 may have an inductance "L" and a capacitance "C" respectively representative by the following Equations (1) and (2):

$$L(nH) \approx 2 \times \ln(5.98\ h/(0.8\ w+t)) \quad (1)$$

$$C(pF) \approx (0.264 \times (\varepsilon r+1.41))/\ln(5.98\ h/(0.8\ w+t)) \quad (2)$$

Moreover, the transfer line CL1 having the structure illustrated in FIG. 4 may have characteristic impedance "$Z_0$" representative by the following Equation (3):

$$Z_0 = 31.6 \times \sqrt{L(nh)/C(pF)} \quad (3)$$

As is evident from Equation (3), the characteristic impedance "$Z_0$" of the transfer line CL1 is proportional to the inductance "L" and is inversely proportional to the capacitance "C".

Moreover, the inductance "L" of the transfer line CL1 may be represented by the following Equation (4):

$$L = \mu \times ((h \times trle)/(w)) \quad (4)$$

where μ is a magnetic permeability, and trle is a length of the transfer line CL1.

As is evident from Equation (4), the characteristic impedance "$Z_0$" of the transfer line CL1 is proportional to the length of the transfer line CL1.

FIG. 5 is a diagram for describing a capacitance between two conductive patterns (or conductive lines) CL3 and CL4. An electric charge "Q+" and an electric charge "Q−" may be respectively applied to the two conductive patterns CL3 and CL4, and a voltage "V" may be applied to the two conductive patterns CL3 and CL4.

An interval between the two conductive patterns CL3 and CL4 may be d, a width between the two conductive patterns CL3 and CL4 may be w, and a surface area of the two conductive patterns CL3 and CL4 may be A. A vacuum permittivity (absolute permittivity) "$\varepsilon_0$" may be provided between the two conductive patterns CL3 and CL4.

A capacitance "C" between the two conductive patterns CL3 and CL4 may be represented by the following Equation (5):

$$C = \varepsilon_0 \times (A/d) \tag{5}$$

As is evident from Equation (5), the capacitance "C" is proportional to an area of the conductive patterns CL3 and CL4 and is inversely proportional to an interval between the conductive patterns CL3 and CL4.

In the above-described electronic device 10 of FIG. 1, an impedance mismatch occurs due to the package balls 108 and 208 when an electrical signal passes through each of the package balls 108 and 208 in the semiconductor devices 100 and 200. In order to solve such a problem, a capacitance of each of the package balls 108 and 208 may decrease, or an inductance of each of the package balls 108 and 208 may increase. Due to a package design, it is difficult to decrease the capacitance of each of the package balls 108 and 208, and thus, the inductance of each of the package balls 108 and 208 may increase.

In order to increase the inductance, a length of the transfer line CL1 may increase. To this end, in the present embodiment, a plurality of impedance matching elements (IM1 and IM1-1 of FIG. 1) (for example, conductive vias) for compensating for an impedance mismatch of an electrical signal caused by the package balls 108 and 208 may be respectively provided under the package balls 108 and 208. The conductive vias 114 and 122 have been described above as the impedance matching elements, but as described below, a spiral inductor may be used for increasing the inductance.

Figure 6:
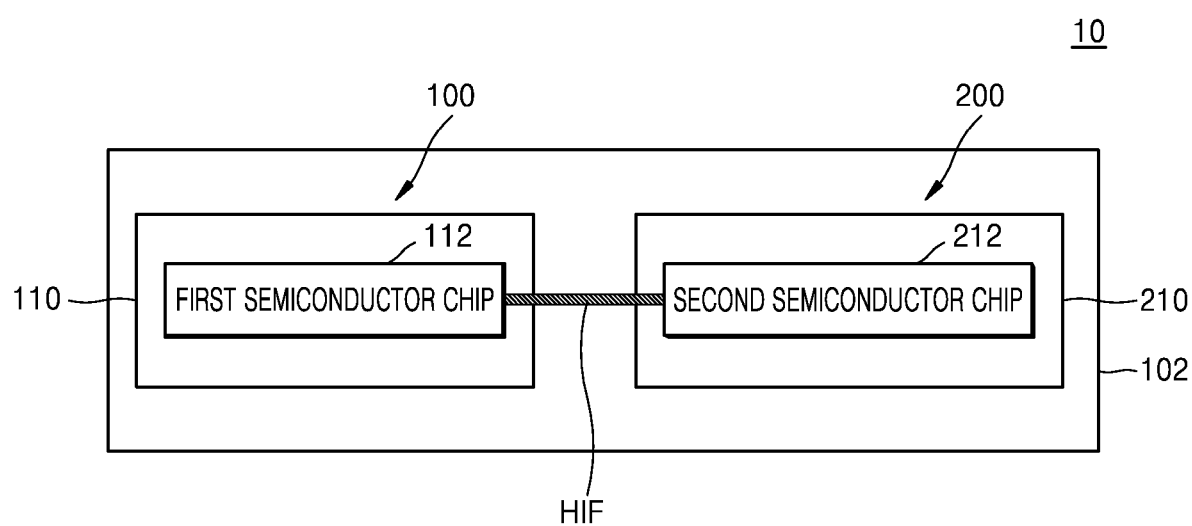
FIG. 6 is a plan view illustrating a main portion of an electronic device according to an embodiment.

FIG. 6 is a plan view illustrating principal portions of an electronic device 10 according to an embodiment. In particular, FIG. 6 is top schematic view of an example of the electronic device 10 of FIG. 1.

Referring to FIG. 6, in the electronic device 10, the first semiconductor device 100 and a second semiconductor device 200 are mounted on the system substrate 102. The first semiconductor device 100 of this example includes the first package substrate 110 and the first semiconductor chip 112 mounted on the first package substrate 110. Likewise, the second semiconductor device 200 of this example includes the second package substrate 210 and the second semiconductor chip 212 mounted on the second package substrate 210.

In the example of FIG. 6, the first semiconductor device 100 is connected to the second semiconductor device 200 through a host interface HIF, and the HIF includes the package balls 108 and 208 and elements of the system substrate 102 described above. The host interface HIF may conform to any of a variety of standards (for example, parallel advanced technology attachment (PATA) standard, serial advanced technology attachment (SATA) standard, small computer system interface (SCSI) standard, peripheral component interconnect express (PCIe) standard, universal frame system (UFS) standard, universal serial bus (USB) standard, and thunderbolt standard).

The SATA standard may be any of the SATA series standards such as SATA-2, SATA-3, and external SATA (e-SATA) as well as SATA-1. The PCIe standard may be any of the PCIe series standards such as PCIe 2.0, PCIe 2.1, PCIe 3.0, and PCIe 4.0 as well as PCIe 1.0. The SCSI standard may be any of the SCSI series standards such as parallel SCSI, serial attached (SA)-SCSI (SAS), iSCSI, etc.

Figure 7:
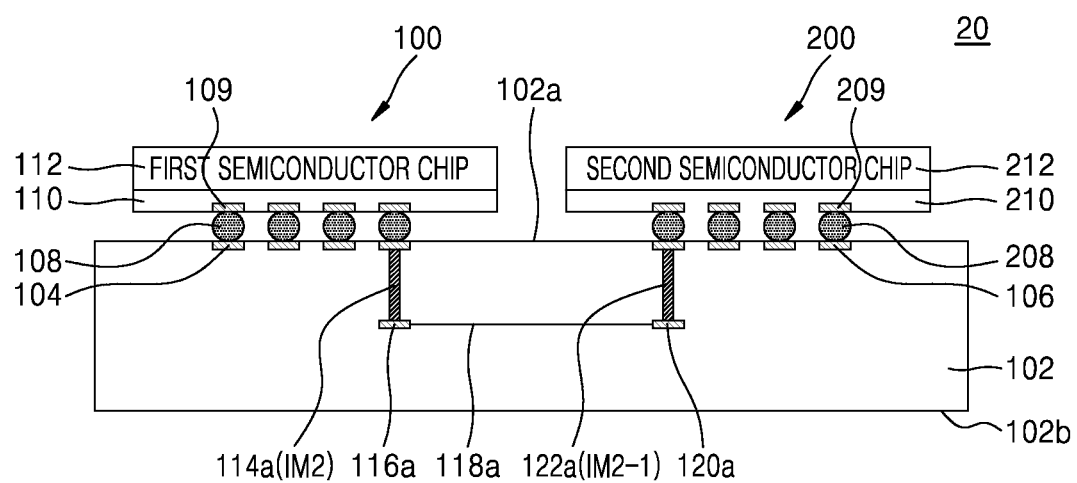
FIG. 7 is a cross-sectional view illustrating a main portion of an electronic device according to an embodiment.

FIG. 7 is a cross-sectional view illustrating principal portions of an electronic device 20 according to another embodiment. In FIG. 7, like reference numbers denote like elements relative to those shown in previously described FIG. 1, and accordingly, a detailed description of such elements is omitted below to avoid redundancy in the disclosure.

The embodiment of FIG. 7 differs from that of FIG. 1 in that vias 114a and 122a used as impedance matching elements IM2 and IM2-1 extend only partly through the system substrate 102. In particular, in the electronic device 20, a plurality of pads 116a and 120a (referred to herein as middle pads) are located at a given depth within the system substrate 102 between the upper surface 102a and lower surface 201b. In addition, a signal trace 118a extends at the given depth between the middle pads 116a and 120a.

Although FIG. 7 illustrates the middle pads 116a and 120a as being located at a depth that is roughly one-half the thickness of the system substrate 102, the embodiments are not limited in this fashion. Indeed, the depth of the middle pads 116a and 120a (and thus the length of the vias 114 and 122a) can be designed to achieve desired impedance matching characteristics (e.g., based on a rise time of an electrical signal waveform obtained from the electronic device 20).

Figure 8:
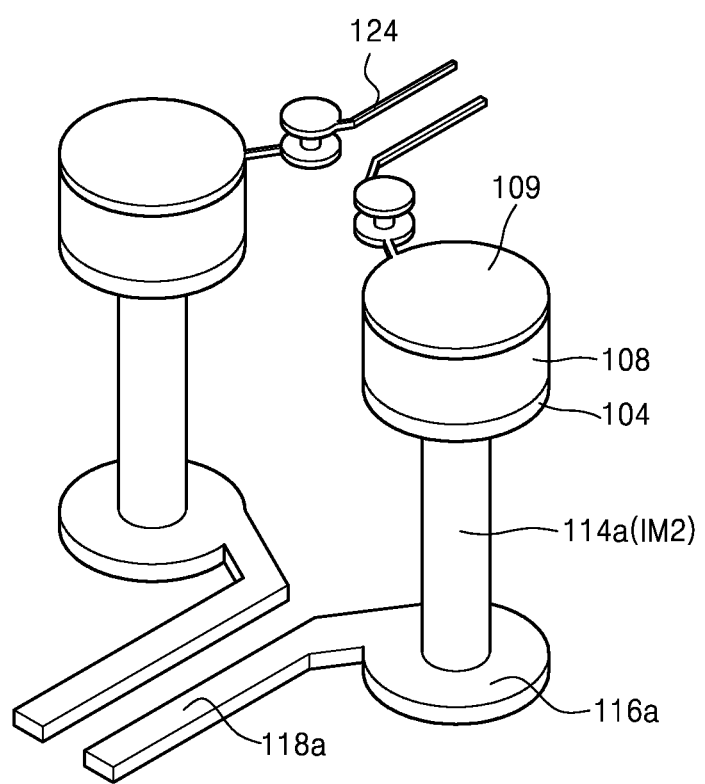
FIG. 8 is a perspective view illustrating a connection relationship between elements provided on and under a package ball of the electronic device of FIG. 7.

FIG. 8 is a perspective view illustrating a connection relationship between elements provided on and under a package ball of the electronic device 20 of FIG. 7.

In detail, FIG. 8 is a diagram for describing a connection relationship between elements provided on and under a package ball 108 of a first semiconductor package (100 of FIG. 7).

As illustrated in FIG. 8, a device ball pad 109 may be disposed on an upper surface of the package ball 108. The device ball pad 109 may be connected to a package conductive line 124. The package conductive line 124 may be a package trace line. A top pad 104 may be disposed on a lower surface of the package ball 108. The top pad 104 may be a conductive via 114a provided in a board substrate (202 of FIG. 7).

The conductive via 114a may be an impedance matching element IM2 which compensates for an impedance mismatch of an electrical signal transferred through the package ball 108. The impedance matching element IM2 may be an element for impedance matching of a transfer line between the device ball pad 109 and a middle pad 116a with respect to the package ball 108. The conductive via 114a may be connected to a signal trace 118a through the middle pad 116a.

Figure 9:
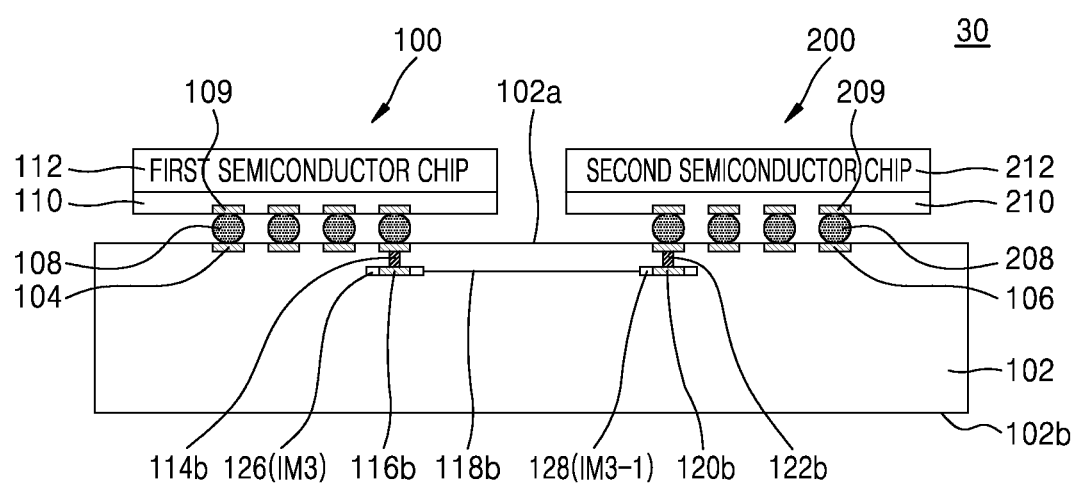
FIG. 9 is a cross-sectional view illustrating a main portion of an electronic device according to an embodiment.

FIG. 9 is a cross-sectional view illustrating a main portion of an electronic device 30 according to an embodiment.

In detail, except for the provision of the spiral inductors 126 and 128 as impedance matching elements IM3 and IM3-1, the electronic device 30 may be the same as the electronic device 10 of FIG. 1. In FIG. 9, like reference numbers denote like elements relative to those shown in previously described FIG. 1, and accordingly, a detailed description of such elements is omitted below to avoid redundancy in the disclosure.

In the electronic device 30, a plurality of middle pads 116b and 120b may be provided in a center portion of a system substrate 102. The middle pads 116b and 120b may be provided to have a certain depth in a direction from an upper surface 102a to a lower surface 102b of the system substrate 102. A conductive via 114b may be provided between a top pad 104 and the middle pad 116b, and the conductive via 122b may be provided between a top pad 106 and the middle pad 120b. The spiral inductor 126 may be provided as the impedance matching element IM3 around the middle pad 116b, and the spiral inductor 128 may be provided as the impedance matching element IM3-1 around the middle pad 120b.

One ends of the middle pads 116b and 120b may be respectively connected to the conductive vias 114b and 122b. The other ends of the middle pads 116b and 120b may be connected to a signal trace 118b provided in the system substrate 102. The conductive vias 114b and 122b may be internal vias provided in the system substrate 102. The signal trace 118b may be an internal board conductive line provided in the system substrate 102. The number of turns of a coil wound around each of the spiral inductors 126 and 128 may be adjusted based on a rising time of an electrical signal waveform obtained from the electronic device 30.

Figure 10:
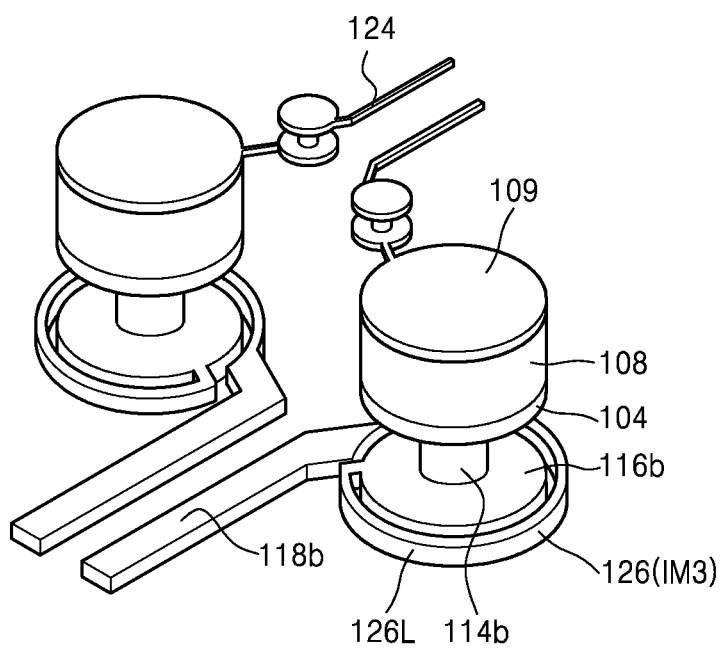
FIG. 10 is a perspective view illustrating a connection relationship between elements provided on and under a package ball of the electronic device of FIG. 9.
Figure 11:
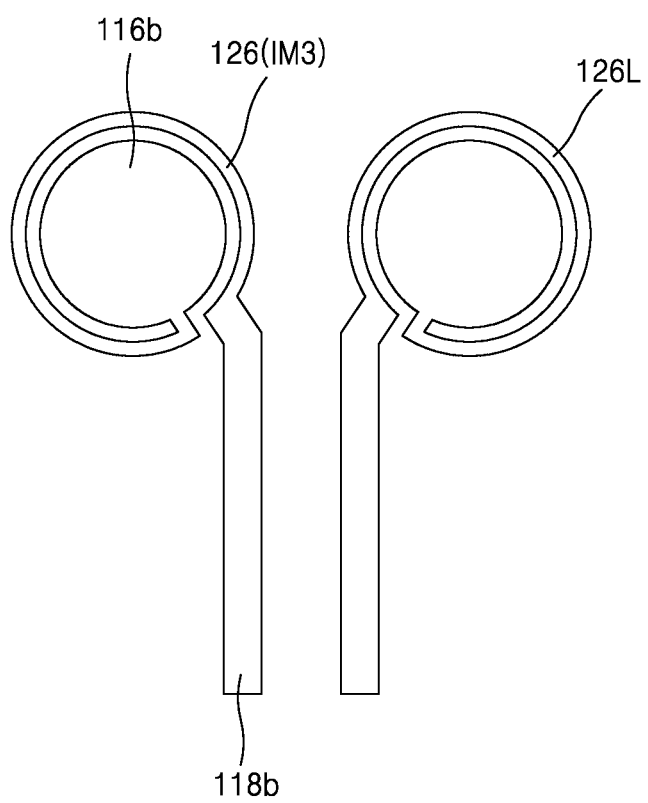
FIG. 11 is a plan view illustrating a spiral inductor provided around a middle pad of FIG. 10.

FIG. 10 is a perspective view illustrating a connection relationship between elements provided on and under a package ball of the electronic device 30 of FIG. 9, and FIG. 11 is a plan view illustrating a spiral inductor provided around a middle pad of FIG. 10.

In detail, FIGS. 10 and 11 are diagrams for describing a connection relationship between elements provided on and under a package ball 108 of a first semiconductor package (100 of FIG. 9).

As illustrated in FIG. 10, a device ball pad 109 may be disposed on an upper surface of the package ball 108. The device ball pad 109 may be connected to a package conductive line 124. The package conductive line 124 may be a package trace line. A top pad 104 may be disposed on a lower surface of the package ball 108. The top pad 104 may be connected to a conductive via 114b provided in a board substrate (102 of FIG. 9).

A middle pad 116b may be provided under the conductive via 114b. The spiral inductor 126 may be provided around the middle pad 116b. The spiral inductor 126 may include a spiral conductive layer 126L provided around the middle pad 116b. A winding number of the spiral conductive layer 126L configuring the spiral inductor 126 may be adjusted based on a rising time of an electrical signal waveform obtained from the electronic device 30.

The spiral inductor 126 may be an impedance matching element IM3 which compensates for an impedance mismatch of an electrical signal transferred through the package ball 108. The impedance matching element IM3 may be an element for impedance matching of a transfer line between the device ball pad 109 and the middle pad 116b with respect to the package ball 108. The spiral inductor 126 may be connected to a signal trace 118b. One end of the spiral conductive layer 126L may be connected to the middle pad 116b, and another end thereof may be connected to the signal trace 118b.

Figure 12:
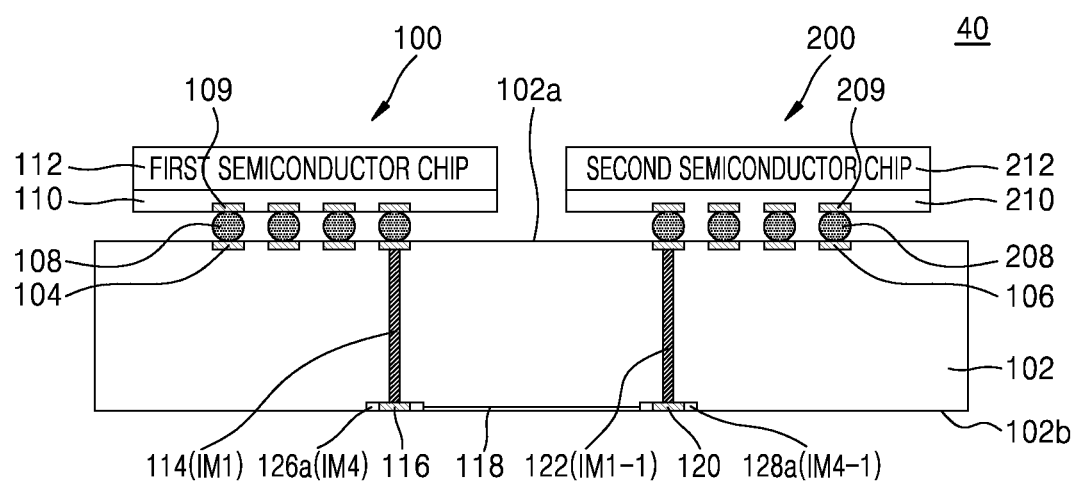
FIG. 12 is a cross-sectional view illustrating a main portion of an electronic device according to an embodiment.

FIG. 12 is a cross-sectional view illustrating a main portion of an electronic device 40 according to an embodiment.

In detail, except for the provision of spiral inductors 126a and 128a as impedance matching elements IM4 and IM4-1, the electronic device 40 may be the same as the electronic device 10 of FIG. 1. In FIG. 12, like reference numbers denote like elements relative to those shown in previously described FIG. 1, and accordingly, a detailed description of such elements is omitted below to avoid redundancy in the disclosure.

In the electronic device 40, a plurality of lower pads 116 and 120 may be provided in a lower portion of a system substrate 102. A conductive via 114 may be provided as an impedance matching element IM1 between a top pad 104 and the lower pad 116, and a conductive via 122 may be provided as an impedance matching element IM1-1 between a top pad 106 and the lower pad 120. A spiral inductor 126a may be provided as the impedance matching element IM4 around the lower pad 116, and a spiral inductor 128a may be provided as the impedance matching element IM4-1 around the lower pad 120.

One ends of the lower pads 116 and 120 may be respectively connected to the conductive vias 114b and 122b. The other ends of the lower pads 116 and 120 may be connected to a signal trace 118 provided in the system substrate 102. Each of the conductive vias 114 and 122 may be a through via provided in the system substrate 102. The signal trace 118b may be an internal board conductive line provided in the system substrate 102. The number of turns of a coil wound around each of the spiral inductors 126a and 128a may be adjusted based on a rising time of an electrical signal waveform obtained from the electronic device 40.

Figure 13:
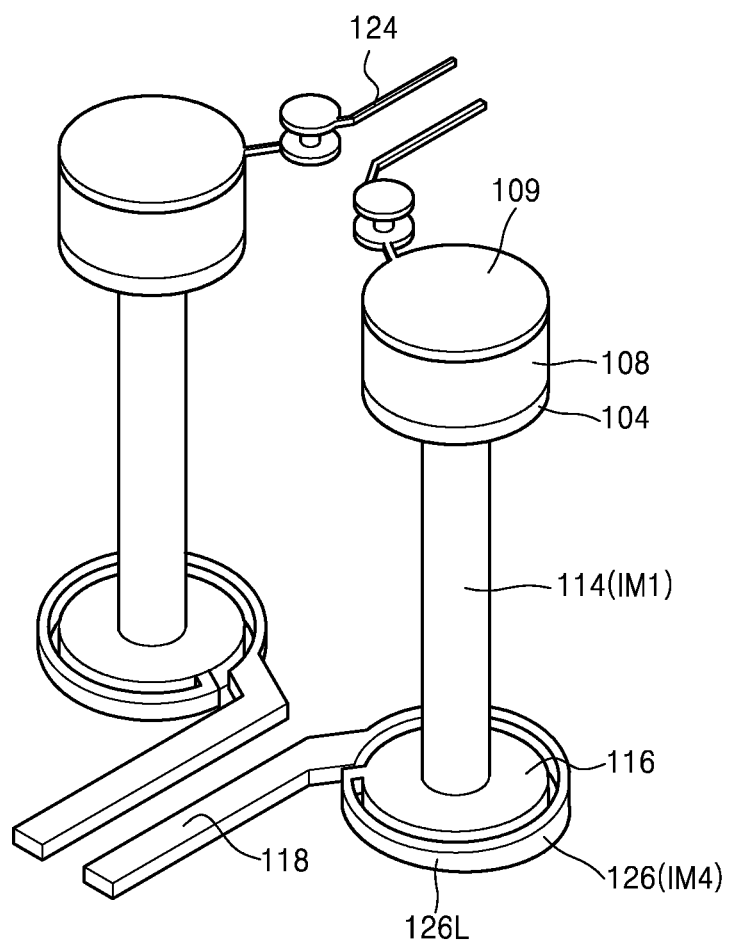
FIG. 13 is a perspective view illustrating a connection relationship between elements provided on and under a package ball of the electronic device of FIG. 12.

FIG. 13 is a perspective view illustrating a connection relationship between elements provided on and under a package ball of the electronic device 40 of FIG. 12.

In detail, FIG. 13 is a diagram for describing a connection relationship between elements provided on and under a package ball 108 of a first semiconductor package (100 of FIG. 12). As illustrated in FIG. 13, a device ball pad 109 may be disposed on an upper surface of the package ball 108. The device ball pad 109 may be connected to a package conductive line 124. A top pad 104 may be connected to a conductive via 114 disposed in a board substrate (102 of FIG. 12).

A lower pad 116 may be provided under the conductive via 114. A spiral inductor 126 may be provided around the lower pad 116. The spiral inductor 126 may include a spiral conductive layer 126L provided around the lower pad 116. A winding number of the spiral conductive layer 126L configuring the spiral inductor 126 may be adjusted based on a rising time of an electrical signal waveform obtained from the electronic device 40.

The spiral inductor 126 may be an impedance matching element IM4 which compensates for an impedance mismatch of an electrical signal transferred through the package ball 108. The impedance matching element IM4 may be an element for impedance matching of a transfer line between the device ball pad 109 and the lower pad 116 with respect to the package ball 108. The spiral inductor 126 may be connected to a signal trace 118. One end of the spiral conductive layer 126L may be connected to the lower pad 116, and another end thereof may be connected to the signal trace 118.

Figure 14:
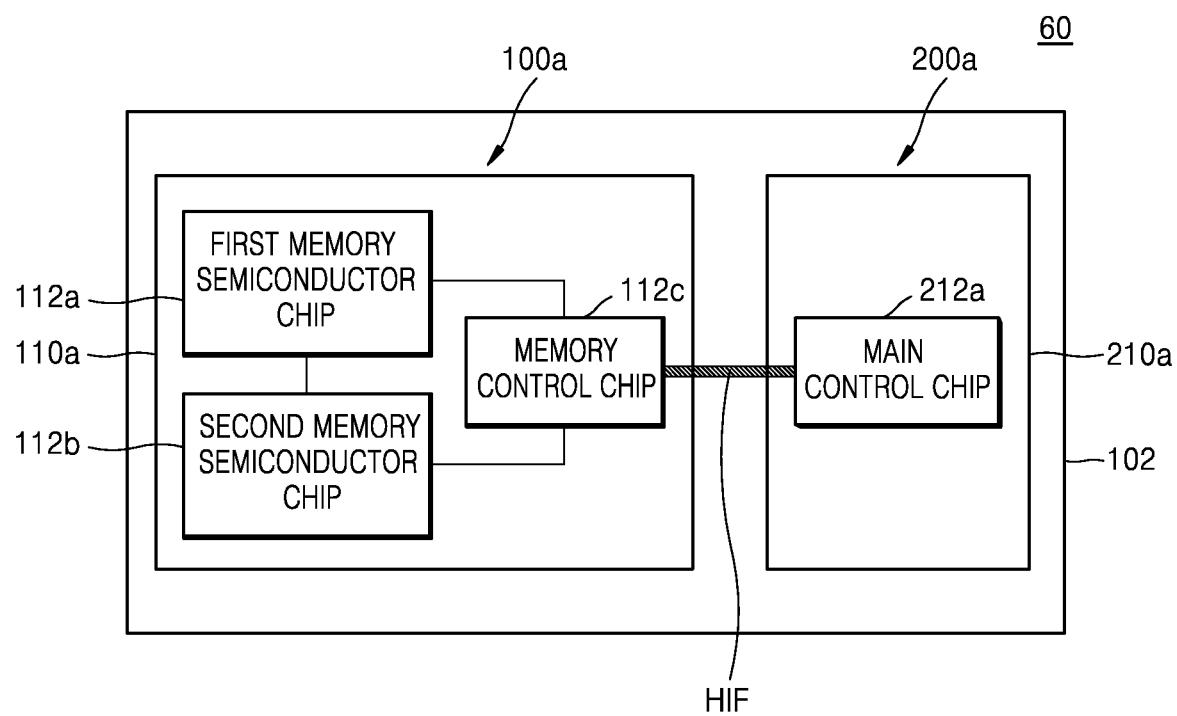
FIG. 14 is a plan view illustrating a main portion of an electronic device according to an embodiment.

FIG. 14 is a plan view illustrating principal portions of an electronic device 60 according to an embodiment.

Referring to FIG. 14, in the electronic device 60, a first semiconductor device 100a and a second semiconductor device 200a may be mounted on a system substrate 102. In the first semiconductor device 100a, a first memory semiconductor chip 112a, a second memory semiconductor chip 112b, and a memory control chip 112c for controlling the first memory semiconductor chip 112a and the second memory semiconductor chip 112b may be mounted on a first system substrate 110a.

The first semiconductor device 100a may be a package module. The second semiconductor device 200a may be a package module on which, in addition to a main control chip 212a, another chip is mounted. In the second semiconductor device 200a, the main control chip 212a may be mounted on the second system substrate 210a.

The memory control chip 112c of the first semiconductor device 100a may be connected to the main control chip 212a of the second semiconductor device 200a through a host interface HIF. The host interface HIF may use one of the standards described above with reference to FIG. 6.

The package balls 108 and 208, the conductive vias 114, 114a, and 114b provided as the impedance matching elements IM1, IM2, IM3, IM4, IM1-1, IM1-1, IM2-1, IM3-1, and IM4-1, the spiral inductors 126 and 126a, and the signal traces 118, 118a, and 118b described above may be elements connected to the host interface HIF of the electronic device 60.

Figure 15:
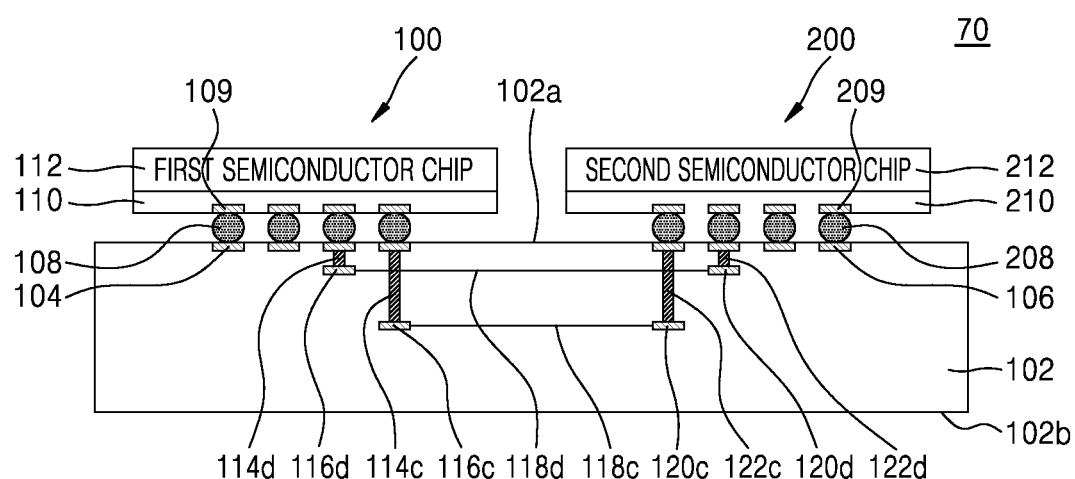
FIG. 15 is a cross-sectional view illustrating a main portion of an electronic device according to an embodiment.

FIG. 15 is a cross-sectional view illustrating principal portions of an electronic device 70 according to an embodiment. In FIG. 15, like reference numbers denote like elements relative to those shown in previously described FIGS. 1, 7 and 9, and accordingly, a detailed description of such elements is omitted below to avoid redundancy in the disclosure.

In detail, except for that the electronic device includes a plurality of conductive vias 114c, 114d, 122c and 122d having different lengths for reducing signal delay difference between channels between semiconductor devices 100 and 200, the electronic device 70 may be the same as the electronic device 10 of FIG. 1. In description given below with reference to FIG. 15, the same description as FIG. 1 will be omitted or briefly given.

The conductive vias 114c and 114d having different lengths may be provided in a first semiconductor device 100. The conductive via 114c may be a via which connects a top pad 104 to a middle pad 116c, and the conductive via 114d may be a via which connects the top pad 104 to a middle pad 116d. The conductive vias 122c and 122d having different lengths may be provided in a second semiconductor device 200. The conductive via 122c may be a via which connects the top pad 104 to a middle pad 120c, and the conductive via 122d may be a via which connects the top pad 104 to a middle pad 120d.

A signal trace 118c may connect the middle pad 116c to the middle pad 120c. A signal trace 118d may connect the middle pad 116d to the middle pad 120d. The conductive vias 114c, 114d, 122c, and 122d may be provided to have different lengths, and thus, may be signal delay difference reduction circuit elements for reducing signal delay difference between channels.

In other words, by using a plurality of package balls 108 and 208, the first and second semiconductor devices 100 and 200 may reduce a difference in signal delays between a first signal delay through signal channels between the conductive via 114c, the signal trace 118c, and the conductive via 122c, and a second signal delay through signal channels between the conductive via 114d, the signal trace 118d, and the conductive via 122d.

Moreover, the conductive vias 114c, 114d, 122c, and 122d may be used as impedance matching elements IM1 and IM1-1. In FIG. 15, the conductive vias 114c, 114d, 122c and 122d are described as the signal delay difference reduction circuit elements, but spiral inductors may be used instead of the conductive vias.

FIGS. 16A to 16D are diagrams for reference in describing a characteristic parameter of a signal input/output to/from an electronic device.

In particular, FIGS. 16A to 16D are diagrams for reference in describing a scattering (S) parameter for evaluating a characteristic of a signal (i.e., an electrical signal) input/output to/from the electronic device according to an embodiment. In FIGS. 16A to 16D, a plurality of ports P1 to P4 are illustrated, and each of the ports P1 to P4 may be an input port through which a signal is input or an output port through which a signal is output.

Figure 16A:
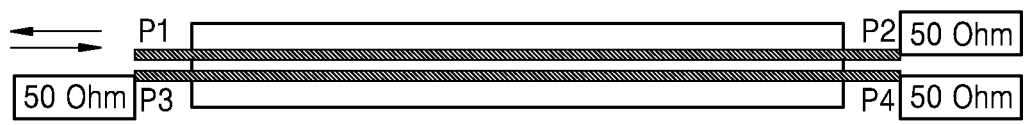
FIGS. 16A to 16D are diagrams for describing a characteristic parameter of a signal input/output to/from an electronic device according to an embodiment.

FIG. 16A is for reference in describing an S11 parameter representing reflection loss. The S11 parameter may be a parameter obtained by measuring a level of a signal which is input to a transfer line through an input port (for example, a port P1) and is reflected back to the input port (for example, the port P1) of the transfer line. The S11 parameter may be a parameter representing a degree to which the transfer line matches a target impedance (for example, 50 ohms).

Figure 16B:
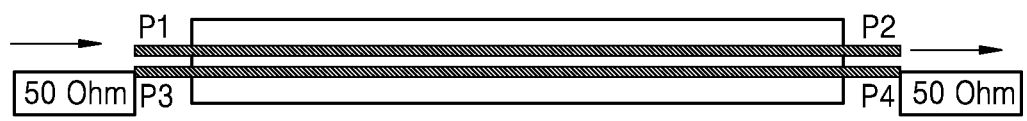

FIG. 16B is for reference in describing an S21 parameter representing insertion loss (or transfer loss). The S21 parameter may be a parameter obtained by measuring a level of a signal which is input to a transfer line through an input port (for example, a port P1) and passes through an output port (for example, a port P2) of the transfer line. The insertion loss may denote a signal transfer ability of the transfer line. The insertion loss may be indicative the integrity of the transferred signal and a bandwidth of a connection part itself.

Figure 16C:
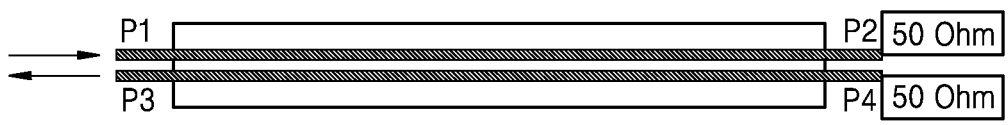

FIG. 16C is for reference in describing an S31 parameter representing proximity crosstalk loss. The S31 parameter may be a parameter representing an influence of a signal on an adjacent input port (i.e., a channel P3) when the signal is input to an input port (for example, a port P1).

Figure 16D:
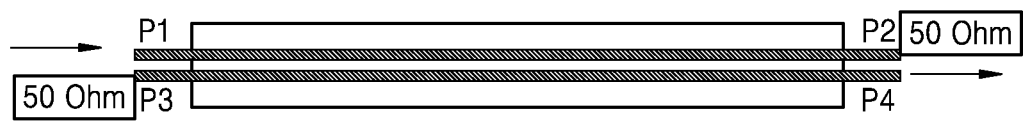

FIG. 16D is for reference in describing an S41 parameter representing long distance crosstalk loss. The S41 parameter may be a parameter representing an influence of a signal on a remote output port (i.e., a channel P4) when the signal is input to an input port (for example, a port P1).

Figure 17:
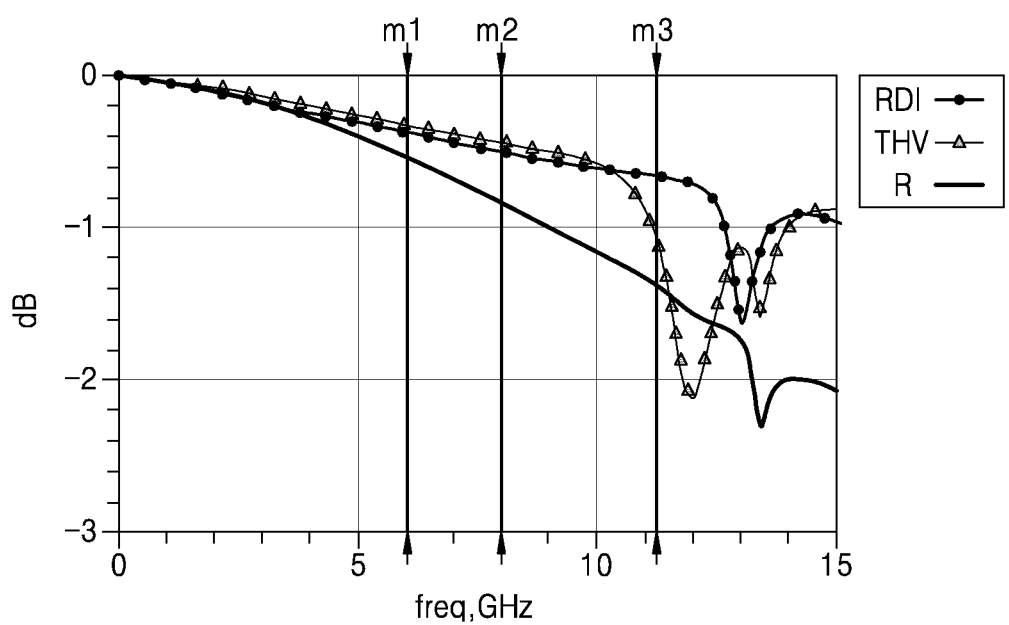
FIGS. 17 to 18 are diagrams for describing a scattering (S) parameter of a signal input/output to/from an electronic device according to an embodiment.
Figure 18:
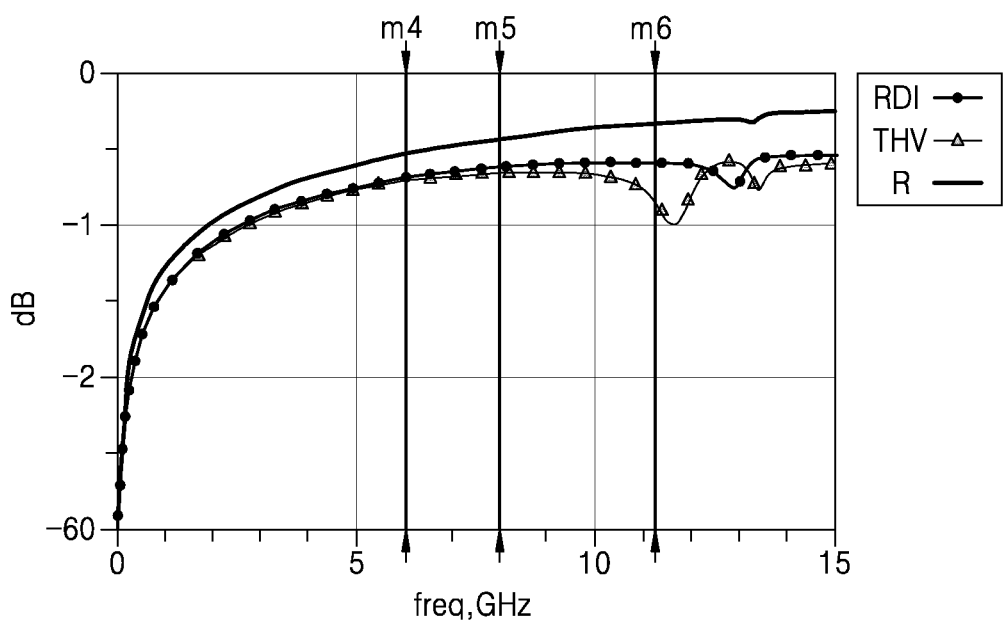

FIGS. 17 to 18 are diagrams for describing certain S parameters of a signal input/output to/from a transfer line from a package ball pad (109 or 209 of FIG. 1) to a middle pad (116a of FIG. 7 or 116b of FIG. 9) or a lower pad (116 of FIG. 1) in the electronic device according to an embodiment.

In particular, FIG. 17 illustrates the S21 parameter representing insertion loss (or transfer loss), and FIG. 18 illustrates the S11 parameter representing reflection loss. In FIGS. 17 and 18, R represents a comparative example including only the package ball 108 components as illustrated in FIG. 3, THV represents an example where a conductive via corresponding to an impedance matching element is connected to the package ball 108 components as illustrated in FIG. 2 (and FIG. 8), and RDI represents an example where a spiral inductor corresponding to an impedance matching element is connected to the package ball 108 components as illustrated in FIG. 10.

As shown in FIGS. 17 and 18, at each of frequencies m1, m2, and m3, both the insertion loss and reflection loss of the electronic device are improved in the embodiments represented by REI and THV, relative to the comparative example of R. These results demonstrate that impedance matching of the signal input/output to/from the transfer line according to the embodiments herein is improved.

Figure 19:
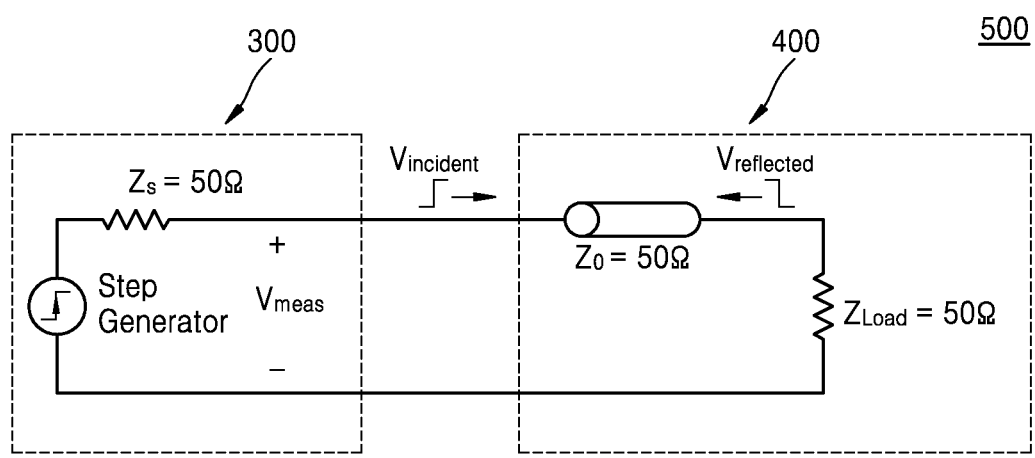
FIG. 19 is a diagram for describing an impedance variation of a signal input/output to/from an electronic device according to an embodiment.

FIG. 19 is a diagram for describing an impedance variation of a signal input/output to/from an electronic device. In particular, the impedance variation of the signal input/output to/from an electronic device may be obtained by a time domain reflectrometry (TDR) apparatus 500. The TDR apparatus 500 of this example includes a TDR module 300 and a measurement device 400. The TDR module 300 may include a step generator for applying a step pulse, and characteristic impedance "$Z_s$" may be set to 50 ohms, for example. In the measurement device 500, as example, a characteristic impedance "$Z_0$" of a transfer line may be set to 50 ohms, and load impedance "$Z_{Load}$" may be set to 50 ohms.

The TDR apparatus 500 may compare the magnitude of an incident voltage wave with the magnitude of a reflected voltage wave to track a variation of impedance. In the TDR apparatus 500, when energy from a transmitter is incident on a transmission medium, impedance varies, and reflected energy is transferred to the transmitter. Accordingly, the amount of the reflected energy is proportional to the amount of transmitted energy and the variation of the impedance.

Figure 20:
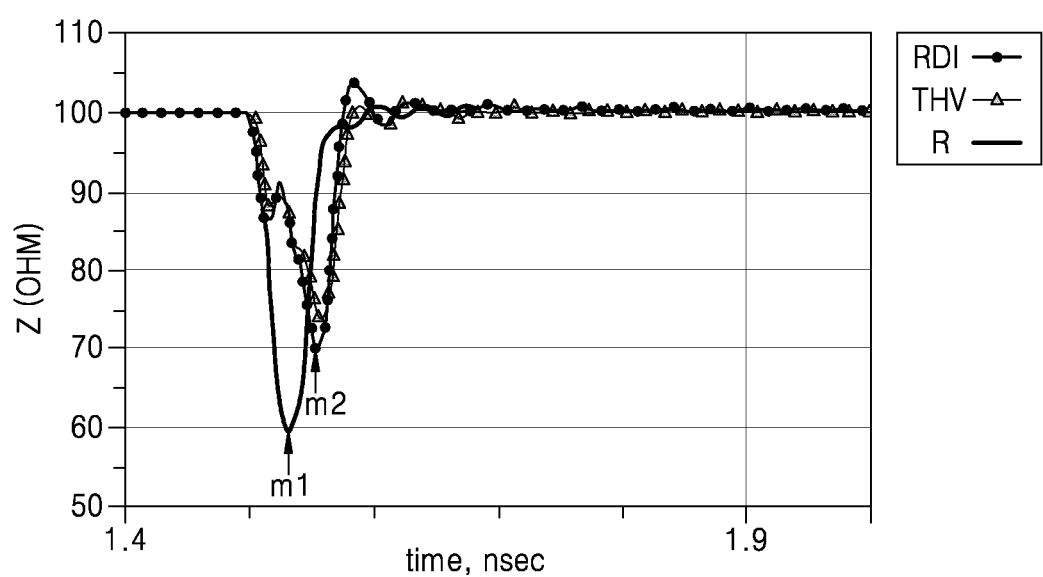
FIG. 20 is a diagram illustrating a time domain reflectrometry (TDR) result of a signal input/output to/from an electronic device according to an embodiment.

FIG. 20 is a diagram illustrating a TDR result of a signal input/output to/from an electronic device according to an embodiment.

In particular, FIG. 20 is a diagram showing results obtained by measuring, using the TDR apparatus 500, a signal input/output to/from a transfer line from a device ball pad (109 or 209 of FIG. 1) to a middle pad (116*a* of FIG. 7 or 116*b* of FIG. 9) or a lower pad (116 of FIG. 1) in the electronic device according to an embodiment. As before, R represents a comparative example including only the package ball 108 components as illustrated in FIG. 3, THV represents an example where a conductive via corresponding to an impedance matching element is connected to the package ball 108 components as illustrated in FIG. 2 (and FIG. 8), and RDI represents an example where a spiral inductor corresponding to an impedance matching element is connected to the package ball 108 components as illustrated in FIG. 10.

As shown in FIG. 20 with reference to times m1 and m2, reflection is improved in the embodiments represented by REI and THV, relative to the comparative example of R. These results further demonstrate that impedance matching of the signal input/output to/from the transfer line according to the embodiments herein is improved.

Figure 21:
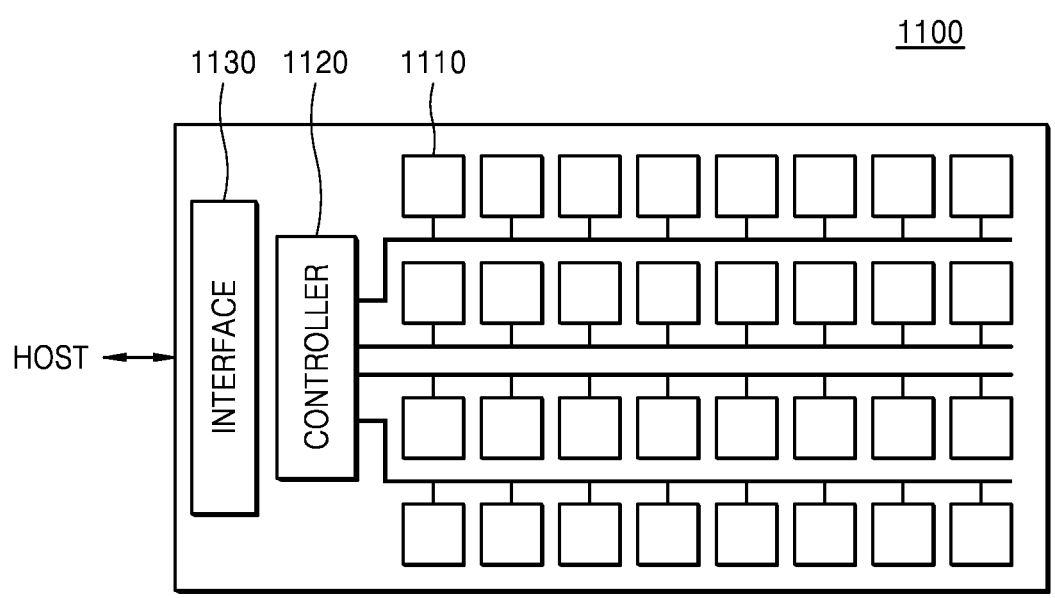
FIG. 21 is a block diagram illustrating a solid state drive device as an example to which an electronic device according to an embodiment is applied.

FIG. 21 is a block diagram illustrating a solid state drive (SSD) device 1100 as an example of an electronic device according to embodiments described herein.

Referring to FIG. 21, the SSD device 1100 of this example includes a plurality of non-volatile memories 1110, a controller 1120, and an interface 1130, which are mounted on a substrate board, such as a system substrate corresponding to embodiments described herein. For example, the substrate board may include impedance matching elements for compensating for an impedance mismatch between the non-volatile memories 1110 and the controller 1120.

In response to a write/read request of a host HOST, the controller 1120 may be responsive to a write/read request of a host HOST through the interface 1130 to read data stored in each of the non-volatile memories 1110, and to store data in each of the non-volatile memories 1110.

The SSD device 1100 may include a variety of other elements not shown, examples of which include one or more resistors, capacitors, inductors, switches, temperature sensors, DC-DC converters, and passive or active elements such as a quartz or voltage regulator for generating a clock.

Figure 22:
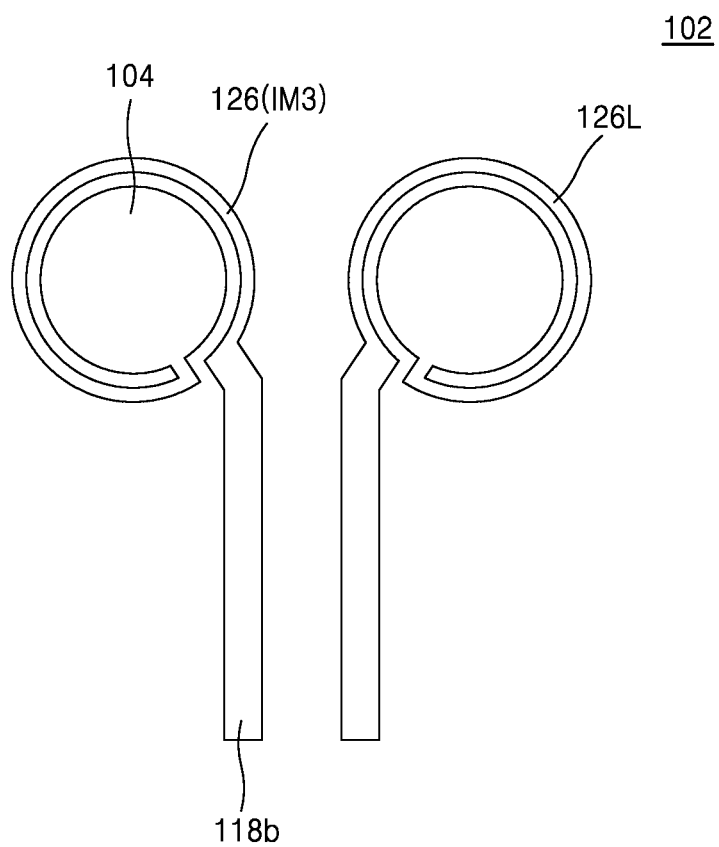
FIG. 22 is a plan view illustrating a spiral inductor according to an embodiment.

FIG. 22 is a diagram for describing another embodiment of the inventive concepts. In the previous embodiments associated with FIGS. 9-13, the spiral inductors for impedance matching are located below an upper surface of the package substrate 102. FIG. 22 illustrates an alternative embodiment where the spiral inductors surround upper pads 104 on the upper surface of the package substrate. Likewise, the differential signal traces 118*b* may also extend along the upper surface of the package substrate 102.

While embodiments of the inventive concept have been particularly shown and described with reference to the drawings, it will be understood that various changes in form and details may be made therein without departing from the spirit and scope of the inventive concept as at least partially set forth by the claims that follow.

What is claimed is:

1. A semiconductor device package comprising a semiconductor chip mounted to an upper surface of a package substrate by a package ball, the package substrate comprising:
   a ball pad on the upper surface of the package substrate and connected to the package ball;
   a signal trace located below the upper surface of the package substrate; and
   an impedance matching element connected between the ball pad and the signal trace, the impedance matching element configured to establish impedance matching with a termination impedance of the semiconductor chip, wherein:
   the signal trace extends horizontally along a lower surface of the package substrate,
   the impedance matching element does not include a capacitor, and
   the impedance matching element includes a conductive via extending between the ball pad and the signal trace to increase inductance.

2. The semiconductor device package of claim 1, wherein the impedance matching element extends vertically within the package substrate.

3. The semiconductor device package of claim 2, further comprising a lower pad on the lower surface of the package substrate and connected to the signal trace, wherein the impedance matching element extends between the ball pad and the lower pad.

4. The semiconductor device package of claim 1, wherein the signal trace extends horizontally between the upper surface of the package substrate and a lower surface of the package substrate, and the impedance matching element extends vertically within the package substrate.

5. The semiconductor device package of claim 4, further comprising a middle pad located between the upper surface of the package substrate and a lower surface of the package substrate and connected to the signal trace, wherein the impedance matching element extends between the ball pad and the middle pad.

6. A semiconductor device package comprising a semiconductor chip mounted to an upper surface of a package substrate by first and second package balls, the package substrate comprising:
   a first ball pad on the upper surface of the package substrate and connected to the first package ball, and a second ball pad on the upper surface of the package substrate and connected to the second package ball;
   first and second signal traces extending parallel to each other and located below the upper surface of the package substrate;
   a first impedance matching element connected between the first ball pad and the first signal trace, the first impedance matching element configured to establish impedance matching with a first termination impedance of the semiconductor chip; and
   a second impedance matching element connected between the second ball pad and the second signal trace, the second impedance matching element configured to establish impedance matching with a second termination impedance of the semiconductor chip, wherein:

the first and second impedance matching elements do not include a capacitor, and the first and second impedance matching elements include conductive vias extending between the first and second ball pads and the first and second signal traces, respectively, to increase inductance.

7. The semiconductor device package of claim 6, wherein the first and second termination impedances are equal.

8. The semiconductor device package of claim 6, wherein the first and second signal traces are for transmitting first and second differential signals, respectively.

9. The semiconductor device package of claim 6, wherein the first and second signal traces extend horizontally along a lower surface of the package substrate, and the first and second impedance matching elements extend vertically within the package substrate.

10. The semiconductor device package of claim 9, further comprising first and second lower pads on the lower surface of the package substrate and connected to the first and second signal traces, respectively,
wherein the first impedance matching element extends between the first ball pad and first the lower pad, and the second impedance matching element extends between the second ball pad and second the lower pad.

11. The semiconductor device package of claim 6, wherein the first and second signal traces extend horizontally between the upper surface of the package substrate and a lower surface of the package substrate, and the first and second impedance matching elements extend vertically within the package substrate.

12. The semiconductor device package of claim 11, further comprising:
a first middle pad located between the upper and lower surfaces of the package substrate and connected to the first signal trace, wherein the first impedance matching element extends between the first ball pad and the first middle pad; and
a second middle pad located between the upper and lower surfaces of the package substrate and connected to the second signal trace, wherein the second impedance matching element extends between the second ball pad and the second middle pad.

13. A semiconductor device package comprising a first semiconductor chip mounted to an upper surface of a package substrate by first and second package balls, and a second semiconductor chip mounted on the upper surface of the package substrate by third and fourth package balls, the package substrate comprising:
first and second ball pads on the upper surface of the package substrate and connected to the first and second package balls, respectively;
third and fourth ball pads on the upper surface of the package substrate and connected to the third and fourth package balls, respectively;
first and second signal traces extending parallel to each other and located below the upper surface of the package substrate;
a first impedance matching element connected between the first ball pad and one end of the first signal trace, and a second impedance matching element connected between the second ball pad and one end of the second signal trace, the first and second impedance matching elements configured to establish impedance matching with first and second termination impedances of first semiconductor chip, respectively; and
a third impedance matching element connected between the third ball pad and another end of the first signal trace, and a fourth impedance matching element connected between the fourth ball pad and another end of the second signal trace, the third and fourth impedance matching elements configured to establish impedance matching with third and fourth termination impedances of second semiconductor chip, respectively, wherein:
the first and second impedance matching elements do not include a capacitor,
the first and second impedance matching elements include conductive vias extending between the first and second ball pads and the one end of the first and signal traces, respectively, to increase inductance,
the third and fourth impedance matching elements do not include a capacitor, and
the third and fourth impedance matching elements include conductive vias extending between the third and fourth ball pads and the other end of the first and signal traces, respectively, to increase inductance.

14. The semiconductor device package of claim 13, wherein the first and second signal traces are for transmitting first and second differential signals, respectively.

15. The semiconductor device package of claim 13, wherein the first and second signal traces extend horizontally along a lower surface of the package substrate, and the first and second impedance matching elements extend vertically within the package substrate.

16. The semiconductor device package of claim 13, further comprising first and second lower pads on a lower surface of the package substrate and connected to the first and second signal traces, respectively, wherein
the first impedance matching element extends between the first ball pad and first the lower pad, and the second impedance matching element extends between the second ball pad and second the lower pad.

17. The semiconductor device package of claim 16, wherein the first impedance matching element includes a first conductive via extending between the first ball pad and the first lower pad, and
wherein the second impedance matching element includes a second conductive via extending between the second ball pad and the second lower pad.

18. The semiconductor device package of claim 16, wherein the first impedance matching element further includes a first spiral conductive layer around the first lower pad and electrically connected between the first signal trace and the first lower pad, and
wherein the second impedance matching element further includes a second spiral conductive layer around the second lower pad and electrically connected between the second signal trace and the second lower pad.

19. The semiconductor device package of claim 13, wherein the first and second signal traces extends horizontally between the upper surface of the package substrate and a lower surface of the package substrate, and the first through fourth impedance matching elements extends vertically within the package substrate.

* * * * *